(12) United States Patent
Weidner et al.

(10) Patent No.: US 11,656,294 B2
(45) Date of Patent: *May 23, 2023

(54) BATTERY DIAGNOSTICS SYSTEM AND METHOD USING SECOND PATH REDUNDANT MEASUREMENT APPROACH

(71) Applicant: Infineon Technologies AG, Neubiberg (DE)

(72) Inventors: Felix Weidner, Munich (DE); Jesus Ruiz Sevillano, Zorneding (DE); Maximilian Hofer, Hartberg (AT)

(73) Assignee: Infineon Technologies AG, Neubiberg (DE)

( * ) Notice: Subject to any disclaimer, the term of this patent is extended or adjusted under 35 U.S.C. 154(b) by 129 days.

This patent is subject to a terminal disclaimer.

(21) Appl. No.: 17/144,813

(22) Filed: Jan. 8, 2021

(65) Prior Publication Data

US 2021/0132156 A1    May 6, 2021

Related U.S. Application Data

(63) Continuation of application No. 15/923,635, filed on Mar. 16, 2018, now Pat. No. 10,901,045.

(51) Int. Cl.
*G01R 31/396* (2019.01)
*G01R 31/36* (2020.01)
(Continued)

(52) U.S. Cl.
CPC ....... *G01R 31/396* (2019.01); *G01R 31/3648* (2013.01); *H01M 10/4285* (2013.01); *H01M 10/482* (2013.01); *H01M 50/569* (2021.01)

(58) Field of Classification Search
CPC ............. G01R 31/396; G01R 31/3648; H01M 10/4285
See application file for complete search history.

(56) References Cited

U.S. PATENT DOCUMENTS 5,640,626 A    6/1997  Makiyama et al.
8,344,794 B2   1/2013  Li
(Continued)

FOREIGN PATENT DOCUMENTS

CN    2203509 Y    7/1995
CN  101043094 A    9/2007
(Continued)

OTHER PUBLICATIONS

Baker, B., "How delta-sigma ADCs work, Part 1", Texas Instruments Incorporated, Data Acquisition, Sep. 19, 2016, 6 pages.
(Continued)

*Primary Examiner* — Paresh Patel
(74) *Attorney, Agent, or Firm* — Slater Matsil, LLP

(57) ABSTRACT

A method for providing battery diagnostics includes: measuring a first voltage across a first battery cell of a rechargeable battery via a first measurement path of a network using a first measurement circuit, measuring the first voltage including taking at least one first voltage sample during a first time period using the first measurement circuit; measuring a second voltage across the first battery cell via a second measurement path of the network using a second measurement circuit, measuring the second voltage including taking at least one second voltage sample during the first time period using the second measurement circuit, where the second measurement path of the network is different from the first measurement path of the network; comparing the measured first voltage with the measured second voltage; and generating a diagnostic output signal based on the comparison.

20 Claims, 9 Drawing Sheets

(51) Int. Cl.
H01M 10/42 (2006.01)
H01M 50/569 (2021.01)
H01M 10/48 (2006.01)

(56) References Cited

U.S. PATENT DOCUMENTS

| | | | |
|---|---|---|---|
| 9,921,270 B2* | 3/2018 | Butzmann | G01R 31/396 |
| 10,266,064 B2* | 4/2019 | Izawa | G01R 31/396 |
| 2003/0038637 A1 | 2/2003 | Bertness et al. | |
| 2007/0069734 A1 | 3/2007 | Bertness | |
| 2011/0254502 A1 | 10/2011 | Yount et al. | |
| 2012/0286794 A1 | 11/2012 | Firehammer et al. | |
| 2013/0057293 A1 | 3/2013 | Miyamoto | |
| 2013/0278273 A1 | 10/2013 | Barlag et al. | |
| 2017/0184683 A1 | 6/2017 | Kobayashi | |

FOREIGN PATENT DOCUMENTS

| | | |
|---|---|---|
| CN | 102141811 A | 8/2011 |
| CN | 105337606 A | 2/2016 |
| CN | 106300522 A | 1/2017 |
| CN | 106353683 A | 1/2017 |
| CN | 107643491 A | 1/2018 |
| JP | 2002543754 A | 12/2002 |
| JP | 2010256335 A | 11/2010 |
| JP | 2012068248 A | 4/2012 |
| JP | 2013024800 A | 2/2013 |
| JP | 2017133974 A | 8/2017 |
| JP | WO2016051684 A1 | 8/2017 |
| JP | 2018013414 A | 1/2018 |
| WO | 0067359 A1 | 11/2000 |

OTHER PUBLICATIONS

Douglass, J., Electronic Product Design, "Battery Management Architectures for Hybrid/Electric Vehicles", Batter Stach Monitor, Medical Design Supplement, Automotive, Mar. 2009, 4 pages.
Hu, Rui, "Battery Management System for Electric Vehicle Applications", University of Windsor, Scholarship at UWindsor, Sep. 16, 2011, 97 pages.
Linear Technology, "SAR ADC Input Types", Apr. 2017.
Linear Technology, LTC6802-1, "Multicell Battery Stack Monitor", Linear Technology Corporation 2009, 38 pages.
Maxim Integrated, "Understanding SAR ADCs: Their Architecture and Comparison with Other ADCs", Tutorial 1080, Oct. 2, 2001, 7 pages.
Maxim Integrated, "Demystifying Delta-Sigma ADCs", Tutorial 1870, Jan. 31, 2003, 15 pages.
TI DESIGNS, "bq76PL536A-Q1 Reference Design" Texas Instruments, TIDUB04—Dec. 2015, 34 pages.

\* cited by examiner

BATTERY DIAGNOSTICS SYSTEM AND METHOD USING SECOND PATH REDUNDANT MEASUREMENT APPROACH

This application is a continuation of U.S. patent application Ser. No. 15/923,635, filed on Mar. 16, 2018, which application is hereby incorporated herein by reference.

TECHNICAL FIELD

The present invention relates generally to an electronic system and method, and, in particular embodiments, to a battery diagnostics system and method using second path redundant measurement approach.

BACKGROUND

Electric vehicles are vehicles that use an electric motor for propulsion. Typically, an electric vehicle uses a battery pack to power the electric motor. A battery pack typically includes a stack of battery cells in series to achieve voltages such as 400 V, or higher. For example, a battery pack may include a stack of 96 lithium-ion battery cells connected in series. Voltages lower than 400 V may also be used.

Since electric vehicles are typically powered by a battery pack, the health of the battery pack is a major safety concern. In some cases, failure of a single battery cell of the battery pack may be catastrophic. For example, due to manufacturing or usage-related variations, some battery cells may have slightly less capacity than other battery cells in the battery pack. Without battery cell balancing, one or more battery cells may fail after multiple charge/discharge cycles.

Vehicles, therefore, typically monitor and periodically rebalance each individual battery cell. The monitoring and balancing of the battery cells is typically done by an external integrated circuit (IC), often called battery stack monitor, battery monitor IC or sensing IC, which is connected to the battery pack via a balancing network. In some implementations, the external IC monitors the voltage across each battery cell of the battery pack and then discharges some of the battery cells based on the monitored voltage to ensure that each battery cell is balanced with respect to the other battery cells in the battery pack. Since the balancing network used to connect the external IC to the battery pack may fail, the external IC may be capable to detect open circuits of the balancing network as another diagnostic feature.

SUMMARY

In accordance with an embodiment, a method for providing battery diagnostics includes: measuring a first voltage across a first battery cell of a rechargeable battery via a first measurement path of a network using a first measurement circuit, measuring the first voltage including taking at least one first voltage sample during a first time period using the first measurement circuit; measuring a second voltage across the first battery cell via a second measurement path of the network using a second measurement circuit, measuring the second voltage including taking at least one second voltage sample during the first time period using the second measurement circuit, where the second measurement path of the network is different from the first measurement path of the network; comparing the measured first voltage with the measured second voltage; and generating a diagnostic output signal based on the comparison.

In an embodiment, a circuit includes: a first measurement circuit configured to be coupled to a first battery cell via a first path of a network; a second measurement circuit configured to be coupled to the first battery cell via a second path of the network, the second path being different than the first path; and a controller configured to: cause the first measurement circuit to measure a first plurality of voltage samples across first and second terminals of the first battery cell during a first time period, cause the second measurement circuit to measure a second plurality of voltage samples across the first and second terminals of the first battery cell during the first time period, compare an output of the first measurement circuit with an output of the second measurement circuit, and generate a diagnostic output signal based on the comparison.

In an embodiment, a battery management system includes: a rechargeable battery including N battery cells coupled in series, where N is a positive integer greater than zero; a balancing network coupled to the rechargeable battery; and a battery monitoring circuit coupled to the balancing network, the battery monitoring circuit including: a sigma-delta analog-to-digital converter (ADC) having an input configured to be coupled to a first battery cell of the N battery cells via a first path of the balancing network, the sigma-delta ADC coupled to a first reference voltage generator; a measurement circuit having an input configured to be coupled to the first battery cell via a second path of the balancing network, the second path being different from the first path, the measurement circuit coupled to a second reference voltage generator different from the first reference voltage generator, the measurement circuit having a different architecture than the sigma-delta ADC; and a controller configured to: control the sigma-delta ADC to measure a first plurality of voltage samples across first and second terminals of the first battery cell during a first time period, control the measurement circuit to measure a second plurality of voltage samples across the first and second terminals of the first battery cell during the first time period, compare an output of the sigma-delta ADC with an output of the measurement circuit, and generate a diagnostic output signal based on the comparison.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
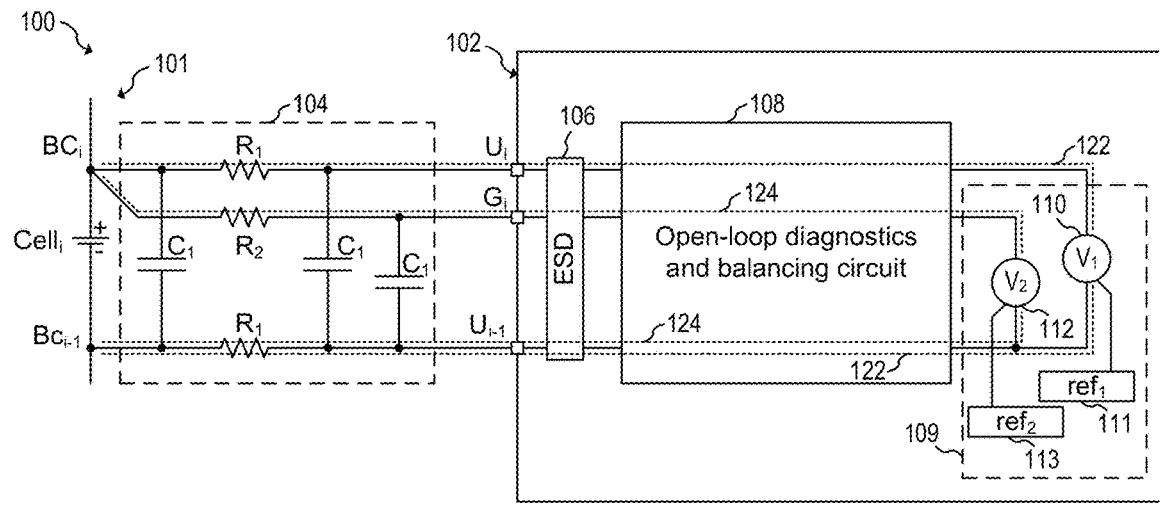
FIG. 1 shows a schematic diagram of a portion of a battery management system, according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to embodiments in a specific context, a diagnostic circuit coupled to a battery pack of an electric vehicle and configured to detect faults in the battery pack, balancing network, and other components internal and external to the diagnostic circuit by using a redundant voltage measurement circuits implemented with different technologies. Some embodiments may be used in systems other than an electric vehicle, such as other systems that measure voltage. Technologies to measure voltage other than the ones described herein may also be used.

System redundancy may be used in safety critical systems, such as battery management systems, to decrease the failure probability of the system. The decrease in the probability of failure is generally most effective when the redundant system and the primary system are uncorrelated (i.e., mutually exclusive). For example, typically, the less the correlated the redundant measurement system is with the primary system, the lower the probability that the primary system and the redundant system fail as a result of a single specific event or root cause (also known as common cause failure).

In an embodiment of the present invention, a battery management system uses a battery monitor IC that uses redundancy to monitor the voltage across each battery cell of a battery pack. The voltage across a battery cell is measured with a primary voltage measurement circuit and with a secondary voltage measurement circuit. The primary and secondary voltage measurement circuits are implemented with different technologies, use different reference voltage generators, and measure the voltage across the battery cell simultaneously via different paths. Faults internal to the battery monitor IC or external to the battery monitor IC, such as faulty components and leaky paths, may be detected by comparing a difference between the voltages measured by the primary and secondary voltage measurement circuits with a voltage threshold.

FIG. 1 shows a schematic diagram of battery management system 100, according to an embodiment of the present invention. Some components and details of battery management system 100 have been omitted for clarity purposes. Battery management system 100 includes battery pack 101 coupled to battery monitor IC 102 via analog filter and balancing network 104. Battery monitor IC 102 includes electrostatic discharge (ESD) protection circuit 106, open-loop diagnostics and balancing circuit 108, and voltage measurement circuit 109. Battery pack 101 includes a plurality of battery cells coupled in series. However, FIG. 1 illustrates only battery cell $cell_i$ of battery pack 101 for clarity purposes.

During normal operation, the voltage across battery cell $cell_i$ is monitored by voltage measurement circuit 109. The voltage measured by voltage measurement circuit 109 is used, for example, to determine whether battery cell $cell_i$ should be discharged to be balanced with respect to other battery cells in battery pack 101. The voltage across battery cell $cell_i$ may also be used to determine whether battery cell $cell_i$ is discharged, or over-charged. The voltage across battery cell $cell_i$ may also be used for other purposes, such as to recalibrate a system-on-chip (SoC) in open circuit voltage (OCV).

Voltage measurement circuit 109 includes redundancy for measuring the voltage across battery cell $cell_i$. For example, voltage measurement circuit 109 includes voltage measurement circuit 110 and voltage measurement circuit 112. Voltage measurement circuits 110 and 112 may be implemented with different measurement schemes. Different measurement schemes involve a different architecture (e.g., SAR ADC or $\Sigma\text{-}\Delta$ ADC) and/or a different measurement principle. For instance, voltage measurement circuit 110 could be implemented as a 13-bit $\Sigma\text{-}\Delta$ ADC with a specific digital filtering and voltage measurement circuit 112 could be implemented as a 16-bit $\Sigma\text{-}\Delta$ ADC using a different digital filtering. Each of the voltage measurement circuits 110 and 112 uses a different reference voltage. Reference generator 111 and 113 generate the reference voltages for voltage measurement circuits 110 and 112, respectively.

As shown in FIG. 1, voltage measurement circuit 110 measures the voltage across battery cell $cell_i$ using path 122 and voltage measurement circuit 112 measures the voltage across battery cell $cell_i$ using path 124. Paths 112 and 124 use different pins of battery monitor IC 102 and use different components of analog filter and balancing network 104. Paths 112 and 124 may also be exposed to different ESD structures, since each pin of battery monitor IC 102 has its own ESD protection circuit. The ESD structures of the pins of IC 102 are collectively shown in FIG. 1 as ESD protection circuit 106 for clarity purposes. Paths 112 and 124 may also be exposed to different circuits of open-loop diagnostics and balancing circuit 108 (depending on the implementation of open-loop diagnostics and balancing circuit 108).

Both voltage measurement circuits 110 and 112 measure the voltage across battery cell cell$_i$ at the same time. The filtering characteristics of paths 112 and 124 are dimensioned to allow for a comparable result when measuring the same signal at the same time by both measurement circuits 110 and 112.

Reference generator circuits 111 and 113 may be implemented in any way known in the art. For example, reference generator circuits 111 and 113 may be implemented by using independent band-gap circuits that supply independent voltages to be used as references for the voltage measurement units 112 and 110. In some embodiments, the architecture of the respective band-gap circuits and voltage regulators may be different. In other embodiments, the architecture of reference generator circuits 111 and 113 may be identical. Other implementations are also possible.

Open-loop diagnostics and balancing circuit 108 detects whether an open circuit condition exists in analog filter and balancing network 104 by performing an open-loop test. Open-loop diagnostics and balancing circuit 108 also discharges battery cell cell$_i$ to a desired voltage to balance battery cell cell$_i$ with respect to other battery cells in battery pack 101. Open-loop diagnostics and balancing circuit 108 may be implemented in any way known in the art. For example, typical implementations include current sources, comparators, and transistors.

Analog filter and balancing network 104 includes a balancing network that includes resistors and an analog filter that includes capacitors that provide filtering in combination with the resistors of the balancing network. As a non-limiting example, in some embodiments, resistors $R_1$ have a resistance of 5Ω, resistor $R_2$ has a resistance of 20Ω, and capacitors $C_1$ have a capacitance of 330 nF. Other resistance and capacitance values may be used. For example, the resistances of resistors $R_1$ and $R_2$ and the capacitances of capacitors $C_1$ may be selected based on the filtering characteristics desired to allow for the measurements and of 112 and 110 to be comparable when measuring the same signal at the same time. In some embodiments, the filtering characteristics of balancing network may be supplemented by subsequent filtering after sampling the voltage to obtain a matching total effective filtering characteristic. Analog filter and balancing network 104 may be implemented with other arrangements, such as shown, for example, in FIGS. 3 and 4.

ESD protection circuit 106 provides a path for ESD discharge to some or all pins of battery monitor IC 102. ESD protection circuit 106 may be implemented in any way known in the art. For example, ESD diodes may be coupled in a reverse biasing configuration between a pin (e.g., U$_i$) and a ground node and/or a battery supply node and/or another pin of battery monitor IC 102. Other implementations are also possible.

Battery monitor IC 102 is implemented in a monolithic semiconductor substrate. In some embodiments, battery monitor IC 102 may be implemented in a multi-chip architecture, where, for example, voltage measurement circuit 110 is disposed in a first monolithic semiconductor substrate together with reference generator in, and voltage measurement circuit 112 is disposed together with reference generator 113 in a second monolithic semiconductor substrate different than the first monolithic semiconductor substrate and packaged in the same package. Other implementations are also possible.

Battery pack 101 includes a plurality of battery cells. For example, battery pack 101 may include 12 rechargeable lithium ion battery cells stacked in series. A different number of battery cells stacked in series may also be used. In some embodiments, stacks of battery cells coupled in series may be coupled to other stacks of battery cells in parallel and/or in series. For example, a battery pack may include 4 stacks of 8 series connected battery cell stacks, where the 4 stacks are connected in parallel, and where each of the 8 series connected battery cell stacks includes 12 lithium ion battery cells connected in series. Some battery packs may use battery cells with a different chemistry. For example, some battery packs may use other lithium based chemistries. Other chemistries may be used.

Advantages of some embodiments include the increase of the common cause robustness of the battery management system by having redundant voltage measurement circuits that rely on independent measurement circuits implemented with different measurement technologies, and using different reference voltages and different measurement paths. Some embodiments further improve the diagnostics capabilities by performing statistical analysis between the voltage measurements of both voltage measurement circuits, such as, for example, checking for correlation between the measurements measured by both voltage measurement circuits.

Figure 2:
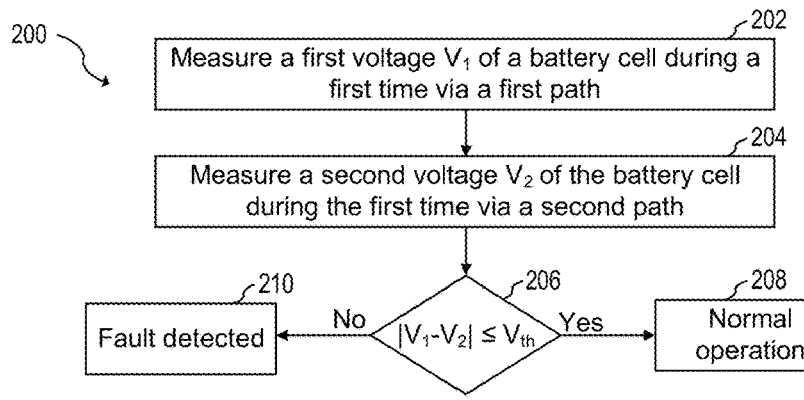
FIG. 2 shows a flow chart of an embodiment method of detecting a failure of a battery management system, according to an embodiment of the present invention.

FIG. 2 shows a flow chart of embodiment method 200 of detecting a failure of a battery management system, according to an embodiment of the present invention. Method 200 may be implemented using battery management system 100. Alternatively, method 200 may be implemented in other battery management system implementations. The discussion that follows assumes that battery management system 100, as shown in FIG. 1, implements method 200.

During step 202, a voltage across a battery cell, such as battery cell cell$_i$ of battery pack 101, is measured by a first voltage measurement circuit, such as, for example, voltage measurement circuit 110. The first voltage measurement circuit is coupled to the battery cell via a network, such as analog filter and balancing network 104. The first voltage measurement circuit measures the voltage across the battery cell via a first path during a first time.

During step 204, the voltage across the battery cell is measured by a second voltage measurement circuit, such as, for example, voltage measurement circuit 112, which is different than the first voltage measurement circuit. The second voltage measurement circuit measures the voltage across the battery cell via a second path during the first time. In other words, the first voltage measurement circuit and the second voltage measurement circuit simultaneously measure the voltage across the battery cell via different paths.

During step 206, the voltage measured by the first voltage measurement circuit is compared with the voltage measured by the second voltage measurement circuit. If the voltages measured by the first and second voltage measurement circuits are substantially equal (e.g., the difference between the measurements is lower than or equal to a voltage threshold V$_{th}$), the battery management system is operating normally, and the measured voltage may be used for other purposes, such as, for example, deciding whether to rebalance the battery cell or stop charging. If the voltages measured by the first and second voltage measurement circuits are different (e.g., the difference between the measurements is higher than the voltage threshold $V_{th}$), a fault is detected.

Since the first and second voltage measurement circuits are measuring the same signal at the same time with comparable filters, sudden changes in the voltage of the battery cell will be equally captured by both voltage measurement circuits. Such common mode rejection allows for the setting of a low voltage threshold $V_{th}$ for determining whether a fault exists. Using a low voltage threshold $V_{th}$ may allow for the detection of faults such as leakage of the capacitor of analog filter and balancing network 104, leakage in pins $U_i$ and/or $G_i$ of the battery monitor IC 102, leakage in the ESD structures, and leakage in transistors 116 and/or 118

In some embodiments, for example using lithium-ion battery cells, it is determined that the first and second voltages are substantially equal if the absolute value of the difference between the first and second voltages is lower than a voltage threshold $V_{th}$ of, e.g., 10 mV. Lower threshold values, e.g., 5 mV or lower, or higher threshold values, e.g., 20 mV, 50 mV or higher, may also be used.

Advantages of some embodiment include the detection of faults beyond open loop detection. For example, leakage in various components internal to the battery monitor IC and external to the battery monitor IC may be detected.

Figure 3:
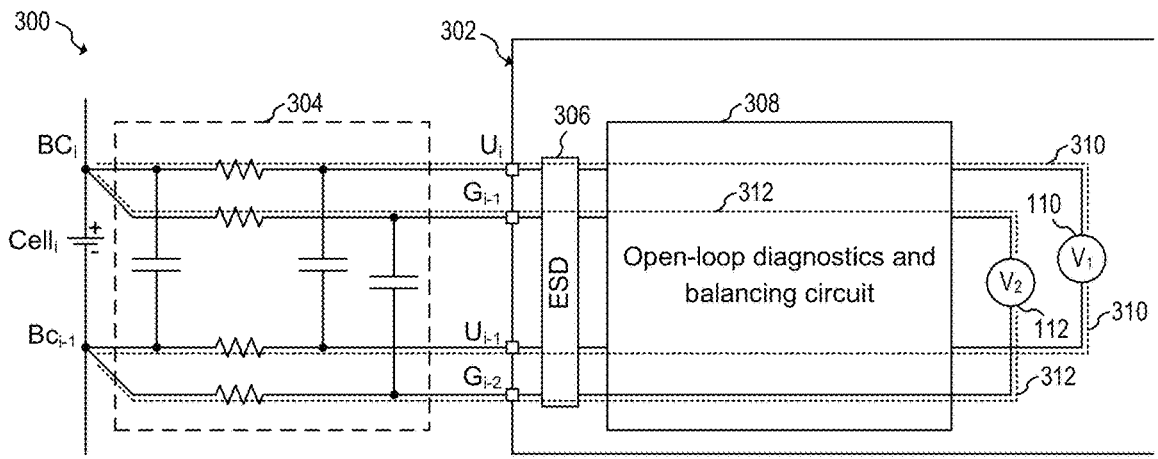
FIG. 3 shows a schematic diagram of a portion of a battery management system, according to another embodiment of the present invention.

FIG. 3 shows a schematic diagram of a portion of battery management system 300, according to another embodiment of the present invention. Battery management system 300 operates in a similar manner than battery management system 100 and may implement method 200 of detecting a failure of the battery management system. However, battery management system 300 includes two different pins along the different paths for monitoring each node across battery cell $cell_i$. For example, node $BC_i$ may be accessed using path 310 via pin $U_i$ or via path 312 using pin $G_{i-1}$, and node $BC_{i-1}$ may be accessed using path 310 via pin or via path 312 using pin $G_{i-2}$.

In some embodiments, voltage measurement circuit 110 is used as a primary measurement circuit to accurately measure the voltage across battery cell $cell_i$ using pins $U_i$ and while voltage measurement circuit 112 is used as a secondary measurement circuit for safety reasons to verify the voltage measured by measurement circuit 110 using pins $G_{i-1}$ and $G_{i-2}$. By using two independent pins for the secondary measurement circuit as shown in FIG. 3, the voltage measured by the secondary measurement circuit is not influenced, e.g., by balancing currents. For example, balancing currents may flow into pin $G_{i-1}$ and out through pin $G_{i-2}$.

Advantages of some embodiments include the inclusion of a redundant voltage measurement path by reusing existing structures of the balancing network, as shown, for example, in FIGS. 1 and 3.

Figure 4:
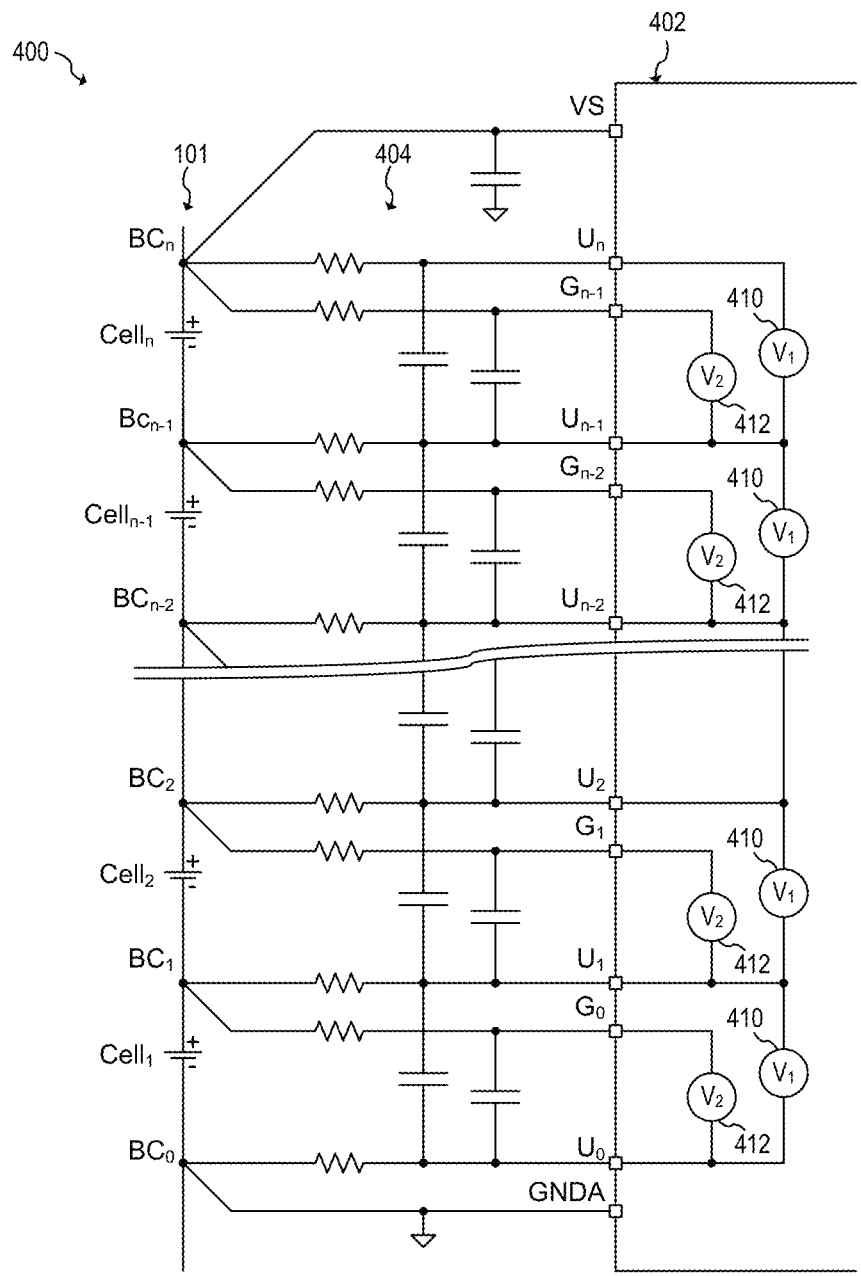
FIG. 4 shows a schematic diagram of a portion of a battery management system, according to an embodiment of the present invention.

FIG. 4 shows a schematic diagram of a portion of battery management system 400, according to an embodiment of the present invention. Some components and details of battery management system 400, such as ESD structures and open-loop diagnostics and balancing circuits, have been omitted for clarity purposes. Battery management system 400 includes n battery cells arranged in series coupled to battery monitor IC 402 via analog filter and balancing network 404. Battery monitor IC 402 includes n voltage measurement circuits 410 and n voltage measurement circuits 412. Each battery cell is coupled to a respective voltage measurement circuit 410 and voltage measurement circuit 412 via analog filter and balancing network 404.

In some embodiments, n may be 12. In such embodiments, voltage at pin VS may be, for example, about 60 V during normal operation. Other embodiments may be implemented with n smaller than 12, such as for example, 6 or lower. Other embodiments may be implemented with values higher than 12, such as 15, 24, or higher.

As shown in FIG. 4, each of the redundant measurement voltage circuits is coupled to the respective battery cell via 3 pins, similar to the configuration shown in FIG. 1. Some embodiments may implement battery management system 400 using a 4 pin configuration, such as shown in FIG. 3.

By having n voltage measurement circuits 410 and n voltage measurement circuits 412, battery management system 400 can simultaneously measure the voltage across each of the n battery cells. In other words, all the battery cells of battery pack 101 may have their associated voltages measured simultaneously and redundantly by the respective voltage measurement circuits 410 and 412.

Figure 5:
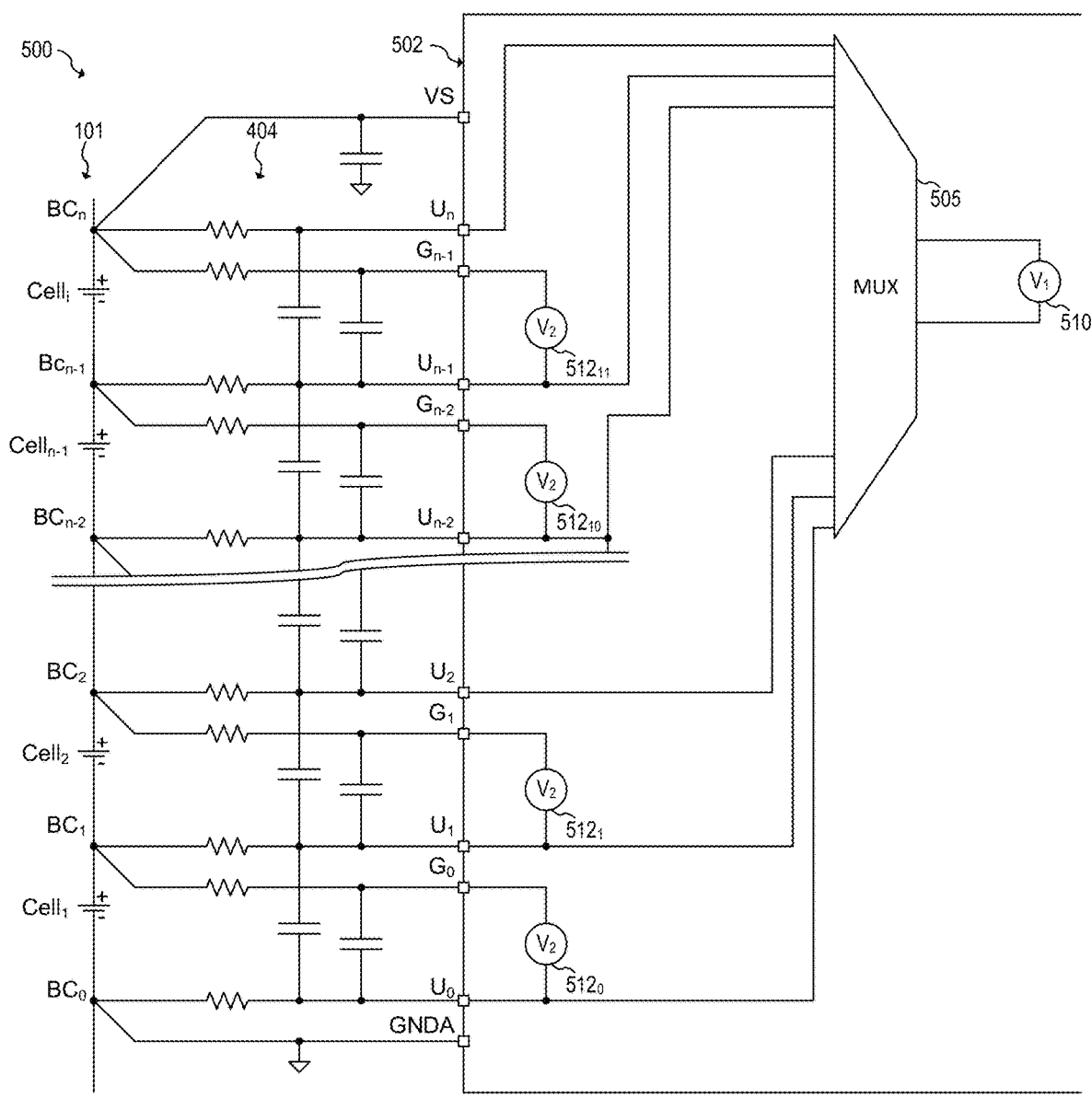
FIG. 5 shows a schematic diagram of a portion of a battery management system, according to another embodiment of the present invention.

Some embodiments may use one or more multiplexers (MUXs) to share a voltage measurement circuit between two or more battery cells. For example, FIG. 5 shows a schematic diagram of a portion of battery management system 500, according to an embodiment of the present invention. Battery management system 500 operates in a similar manner than battery management system 400. Battery management system 500, however, shares voltage measurement circuit 510 over the n battery cells of battery pack 101 using MUX 505 instead of having n voltage measurement circuits 510.

Battery management system 500 simultaneously measures the voltage across each of the n battery cells of battery pack 101 using voltage measurement circuit 510 and the respective voltage measurement circuit 512. For example, the voltage across battery cell $cell_1$ is measured simultaneously by measurement circuit $512_0$ and by voltage measurement circuit 510, where MUX 505 is configured to select the channels associated with battery cell $cell_1$. After the voltage across battery cell $cell_1$ is measured, the voltage across battery cell $cell_2$ may be measured simultaneously by measurement circuit 512, and by voltage measurement circuit 510, where MUX 505 is configured to select the channels associated with battery cell $cell_2$. The sequence is repeated for each of the battery cells in battery pack 101, although not necessarily in that order.

As shown in FIG. 5, voltage measurement circuit 510 is shared over the n battery cells of battery pack 101. Some embodiments, may share a voltage measurement circuit 510 over k battery cells, where k is smaller than or equal to n.

Figure 6:
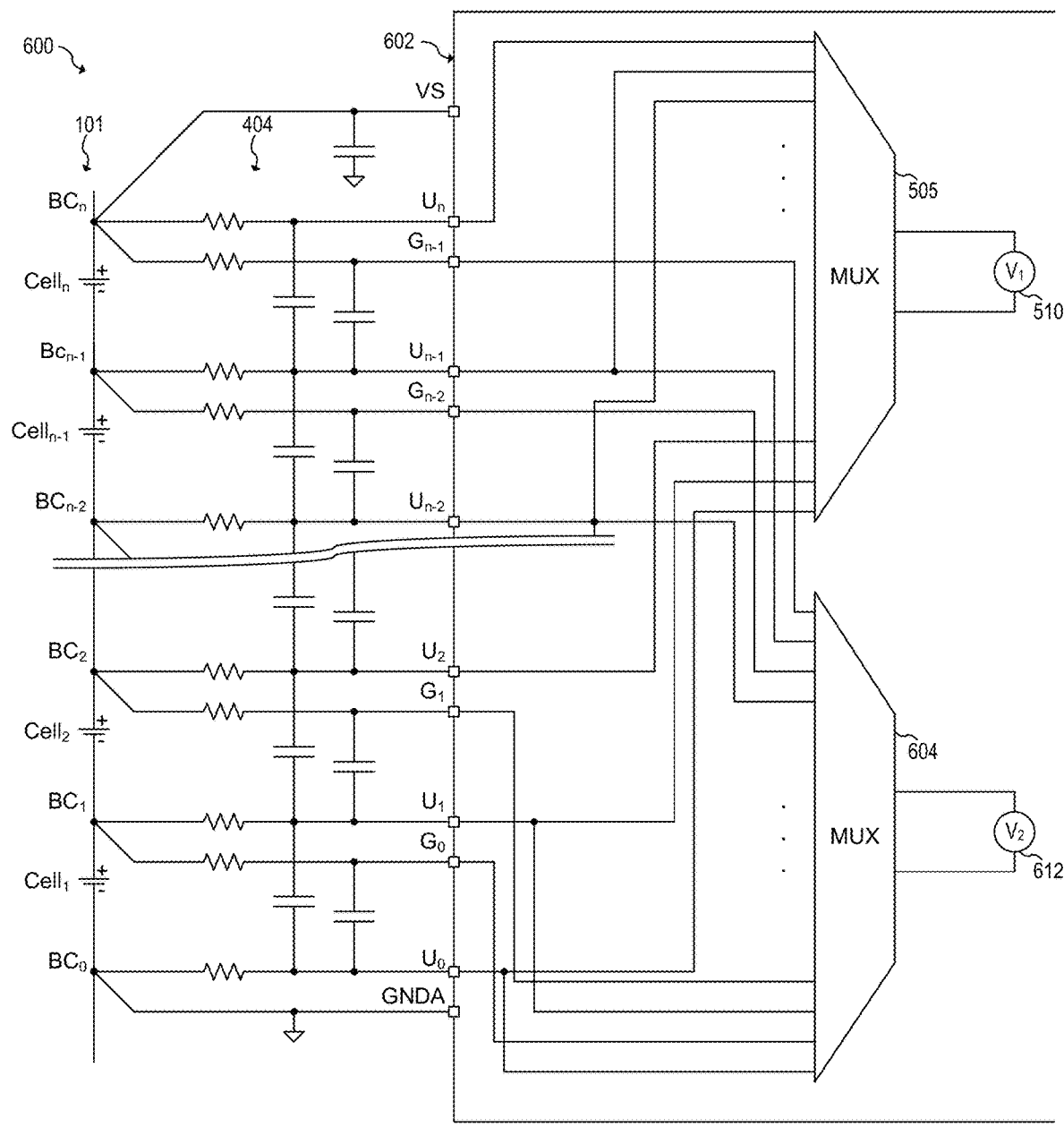
FIG. 6 shows a schematic diagram of a portion of a battery management system, according to yet another embodiment of the present invention.

Some embodiments may also share voltage measurement circuit 512 over more than one battery cells. For example, FIG. 6 shows a schematic diagram of a portion of battery management system 600, according to an embodiment of the present invention. Battery management system 600 operates in a similar manner than battery management system 500. Battery management system 600, however, shares voltage measurement circuit 512 over the n battery cells of battery pack 101 using MUX 604 instead of having n voltage measurement circuits 512.

Battery management system 600 simultaneously measures the voltage across each of the n battery cells of battery pack 101 using voltage measurement circuits 510 and 612. For example, the voltage across battery cell $cell_1$ is measured simultaneously by measurement circuit 510 and 612, where MUXes 505 and 604 are respectively configured to select the channels associated with battery cell $cell_1$. After the voltage across battery cell $cell_1$ is measured, the voltage across battery cell $cell_2$ may be measured simultaneously by measurement circuits 510 and 612, where MUXes 505 and 604 are respectively configured to select the channels associated with battery cell $cell_2$. The sequence is repeated for each of the battery cells in battery pack 101, although not necessarily in that order.

As shown in FIG. 6, voltage measurement circuit 612 is shared over the n battery cells of battery pack 101. Some embodiments, may share a voltage measurement circuit 612 over j battery cells, where j is smaller than n. In some embodiments, j may be equal to k. In some embodiments, j, k and n may be equal to each other.

Figure 7:
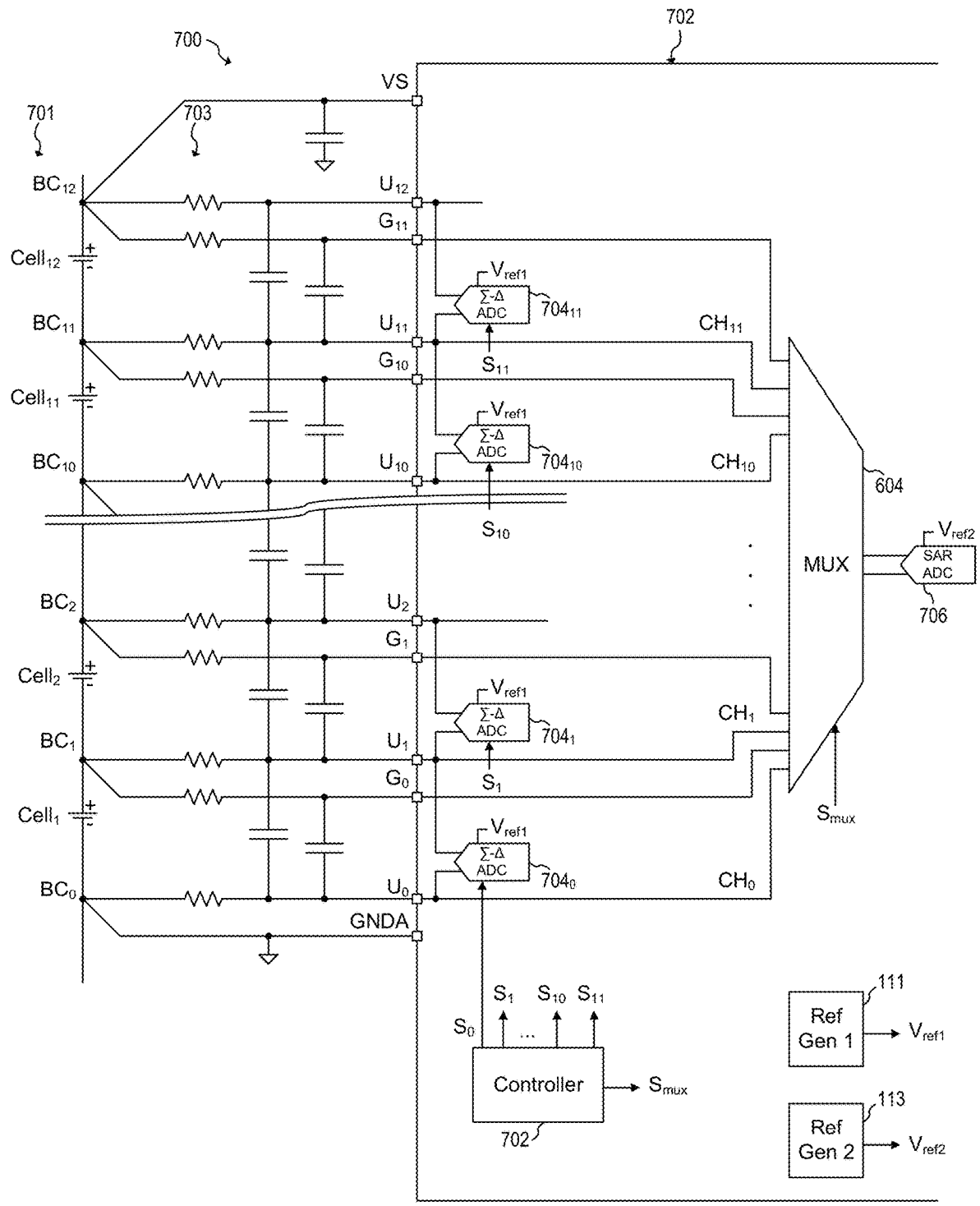
FIG. 7 shows a schematic diagram of a portion of a battery management system, according to an embodiment of the present invention.

FIG. 7 shows a schematic diagram of a portion of battery management system 700, according to an embodiment of the present invention. Battery management system 700 includes battery pack 701 (which has for example 12 lithium ion battery cells), and battery monitor IC 702 coupled to battery pack 701 via analog filter and balancing network 703. Battery management system 700 operates in a similar manner than battery management system 600. Battery management system 700, however, implements voltage measurement circuit 612 with SAR ADC 706 and implements 12 Σ-Δ ADC 704, each coupled to the respective battery cell of battery pack 701 via analog filter and balancing network 703 instead of a single voltage measurement circuit 510 coupled to the battery pack via MUX 505. Reference generator 111 provides reference voltage $V_{ref1}$ to all 12 Σ-Δ ADC 704 while reference generator 113 provides reference voltage $V_{ref2}$ to SAR ADC 706.

During normal operation, controller 702 configures MUX 604 to select a channel (e.g., $CH_0$) associated with a particular battery cell (e.g., $cell_1$) and configures SAR ADC 707 and the respective Σ-Δ ADC 704 (e.g., Σ-Δ ADC $704_0$) to measure the voltage across the particular battery cell simultaneously. The process is repeated for each of the battery cells in battery pack 701.

As known, although Σ-Δ ADC 704 and SAR ADC 706 each produce a digital value associated with the sampled analog voltage at the input, Σ-Δ ADC 704 and SAR ADC 706 produces their respective digital value by using a different architecture and operating principle. For example, a SAR ADC typically samples and holds an analog voltage sample at the ADC input, and then generates a voltage with an m-bit DAC and compares the voltage generated from the m-bit DAC with the voltage sampled at the input using a comparator. The digital output produced by the SAR ADC is the digital code that when used to configure the m-bit DAC generates the voltage that is closest to that of the sampled input. Typically, a SAR ADC uses binary search to find such m-bit DAC code. The m-bit DAC typically has 8, 10, 12, or more bits.

A Σ-Δ ADC uses a combination of oversampling and noise shaping techniques to convert the analog input into a digital output. Typically, a 1-bit DAC is used in combination with a differentiator, an integrator and digital filtering to produce the digital code. In contrast to the SAR ADC, the Σ-Δ ADC is mostly implemented using digital logic rather than analog components. SAR ADCs and Σ-Δ ADCs are well known in the art and will not be discussed further.

Since Σ-Δ ADCs and SAR ADCs typically have different sampling rates, the filtering characteristics of analog filter and balancing network 703 may be designed to prevent aliasing for both types of ADCs. In some embodiments, anti-aliasing is achieved by reducing noise to values lower than e.g., 1 mV, at a frequency fs/2, where fs is the sampling frequency of the slowest ADC (e.g., SAR ADC).

Battery monitor IC 702 is implemented in a monolithic semiconductor substrate. In some embodiments, battery monitor IC 702 may be implemented in a multi-chip architecture, where, for example, SAR ADC 706 and MUX 604 are disposed in a first monolithic semiconductor substrate together with reference generator in, and Σ-Δ ADC 704 are disposed together with reference generator 113 in a second monolithic semiconductor substrate different than the first monolithic semiconductor substrate and packaged in the same package. Other implementations are also possible.

Figure 8:
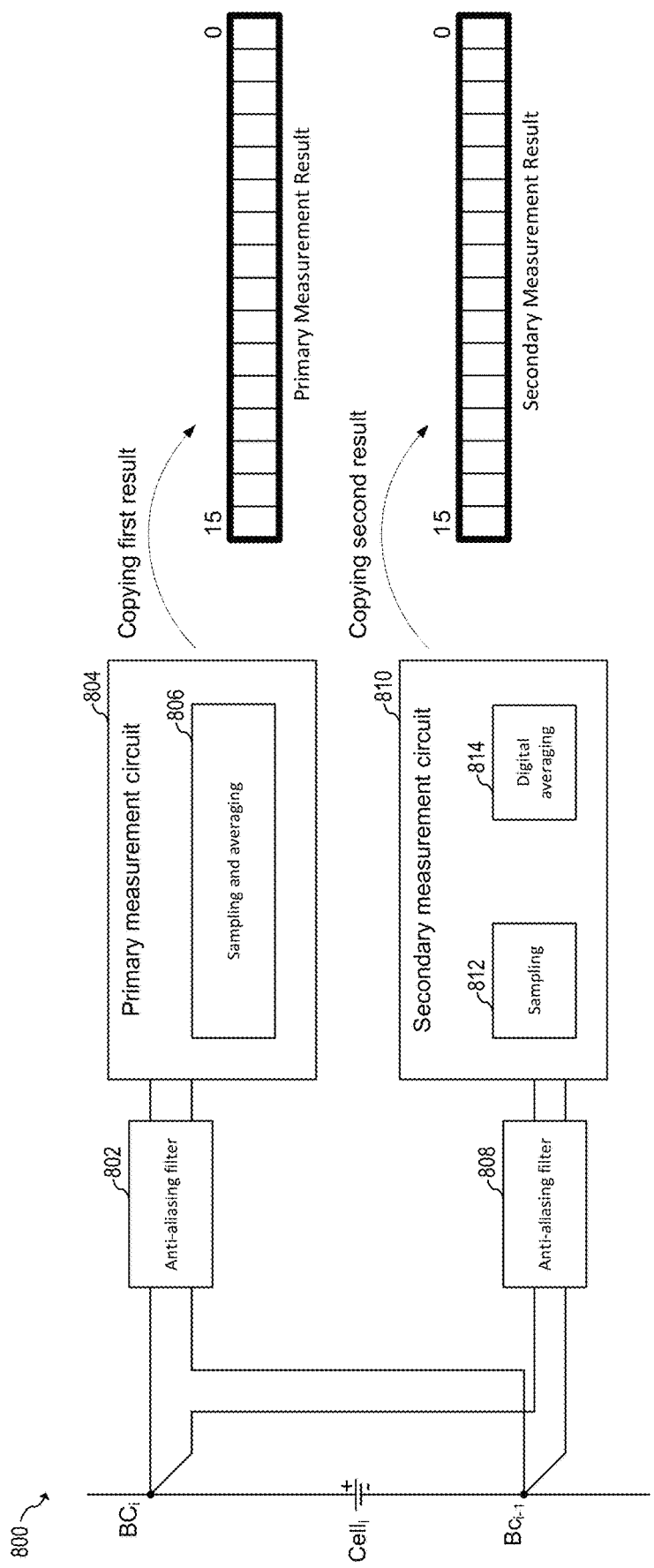
FIG. 8 shows a schematic diagram that illustrates a possible measurement system for achieving simultaneous measurements, according to an embodiment of the present invention.

FIG. 8 shows a schematic diagram of measurement system 800 for achieving simultaneous measurements, according to an embodiment of the present invention. Measurement system 800 simultaneously measures the voltage across cell $cell_i$ for the same duration of time with primary measurement circuit 804 and secondary measurement circuit 810 and generates a primary measurement result and a secondary measurement result based on the respective measured voltage. In some embodiments, voltage measurement circuit 110 may be implemented as primary measurement circuit 804 and voltage measurement circuit 112 may be implemented as secondary measurement circuit 810.

Measurement system 800 includes primary measurement circuit 804, secondary measurement circuit 810, and anti-aliasing filters 802 and 808. In some embodiments, antialiasing filters 802 and 808 correspond to analog filters and balancing networks (e.g., such as 104, 404 and 703, previously described). FIG. 8 shows a primary measurement result and a secondary measurement result each having 16 bits. It is understood that other values, such as 8 bits, 12 bits, 14 bits, 24 bits, 32 bits, may be used.

Primary measurement circuit 804 has a total effective filtering characteristic that includes the filtering characteristics of anti-aliasing filter 802 and sampling and averaging block 806. Secondary measurement circuit 810 has a total effective filtering characteristic that includes the filtering characteristics of anti-aliasing filter 808, and sampling block 812 and digital averaging block 814. The total effective filtering characteristics of primary measurement circuit 804 and secondary measurement circuit 810 are dimensioned to allow for measuring the same signal at the same time by both measurement circuits 804 and 810.

In some embodiments, the total effective filtering characteristics of measurement circuits 804 and 810 is matched by having similar dominant poles and similar step responses. As a non-limiting example, in an embodiment where primary measurement circuit 804 is implemented with a Σ-Δ ADC, and secondary measurement circuit 810 is implemented with a SAR ADC, anti-aliasing filter 802 may have a pole of about 500 kHz, the Σ-Δ ADC has a sampling and averaging block 806 that may sample the respective input signal at about 20 MHz and have an averaging N-order filter with a pole at about 100 Hz, where n may be greater or equal to 1, anti-aliasing filter 808 may have a pole of about 10 kHz, the SAR ADC has a sampling block 812 that may sample the input signal at about 400 Hz, and an N-order digital averaging block 814 may perform digital averaging with a pole at about 100 Hz. In this example, the dominant pole of each of measurements circuits 804 and 810 is about 100 Hz with the same frequency slope (e.g., 20 dB per decade when n is equal to 1). Other values for the pole frequencies, sampling frequencies and order of the filters may be used.

Some embodiments may achieve similar (matched) total effective filtering characteristics without having equal dominant poles that decay at the same rate. For example, in some embodiments, primary measurement circuit 804 may have a first order pole at 100 Hz and a first order pole at 105 Hz while secondary measurement circuit 810 may have a second order pole at 99 Hz. In such embodiment, the total effective filtering characteristic of primary measurement circuit 804 is considered as matching the total effective filtering characteristic of secondary measurement circuit 81o. Other filtering characteristics and other values for the dominant poles and frequency slopes may be used.

In some embodiments, the Σ-Δ ADC is implemented with a first order cascaded integrator-comb (CIC) filter. The CIC filter may be implemented in any way known in the art.

In some embodiments, measurements circuits 804 and 810 may be implemented in the same manner. For example, in some embodiments, measurement circuits 804 and 810 may both be implemented with Σ-Δ ADCs. In some embodiments, measurement circuits 804 and 810 may both be implemented with SAR ADCs. In yet other embodiments, primary measurement circuit 804 is implemented with a Σ-Δ ADC while secondary measurement circuit 810 is implemented with comparators. Other implementations are also possible.

Figure 9:
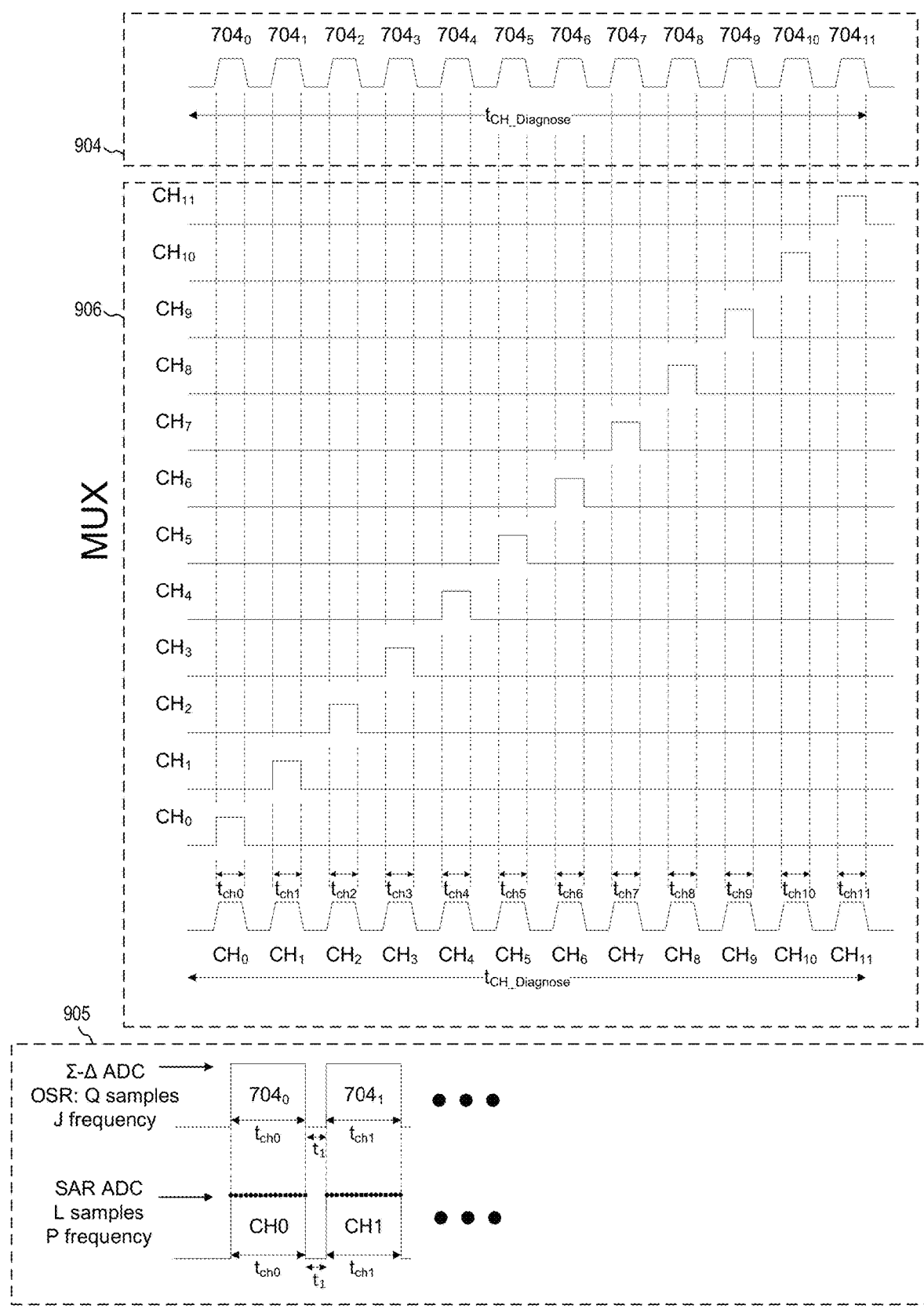
FIG. 9 illustrates timing diagrams for measuring voltage across each of the battery cells of the battery management system of FIG. 7, according to an embodiment of the present invention.

FIG. 9 illustrates timing diagrams for measuring voltage across each of the 12 battery cells of battery pack 701, according to an embodiment of the present invention. Waveform 904 corresponds to conversion timing of Σ-Δ ADC 704. Waveform 906 corresponds to conversion timing of SAR ADC 706 and associated MUX 604. Waveform 905 is a zoomed-in version of a portion of waveforms 904 and 906.

As shown in FIG. 9, during diagnostic time $t_{CH\_Diagnose}$ the voltage across each of the 12 battery cells of battery pack 701 are measured. For example, during time $t_{ch0}$, Σ-Δ ADC 704$_0$ measures the voltage across battery cell cell$_1$ while SAR ADC 706 measures the voltage across channel CH$_0$ of MUX 604, which is associated with the voltage across battery cell cell$_1$. During time $t_{ch1}$, Σ-Δ ADC 7041 measures the voltage across battery cell cell$_2$ while SAR ADC 706 measures the voltage across channel CH$_1$ of MUX 604, which is associated with the voltage across battery cell cell$_2$. The sequence is repeated for all the 12 battery cells of battery pack 701.

As shown in waveform 905, SAR ADC 706 and the respective Σ-Δ ADC 704 measures the voltage across the respective battery cell at the same time and for the same duration of time. In other words, even though SAR ADC 706 typically collects a smaller number of samples than Σ-Δ ADC 704 during the measurement time, the time during which the samples are collected should be the same. The samples collected by each ADC during the measurement time are then respectively averaged (e.g., by using a low pass filter) to obtain a respective final value. For example, the frequency J of Σ-Δ ADC 704 and the number of Q input samples taken by Σ-Δ ADC 704 are selected to take the same time as the time taken by SAR ADC 706 to take L samples at a frequency P. As a non-limiting example, if the duration of time $t_{ch0}$ is 75 μs, SAR ADC 706, which operates at 666 kHz, collects 50 input samples while Σ-Δ ADC 704$_0$ takes 1024 samples of the input signal while operating at an over-sampling rate of 13.65 MHz. In some embodiments, time $t_1$ between conversions is minimized, for example, to 1 μs.

Figure 10:
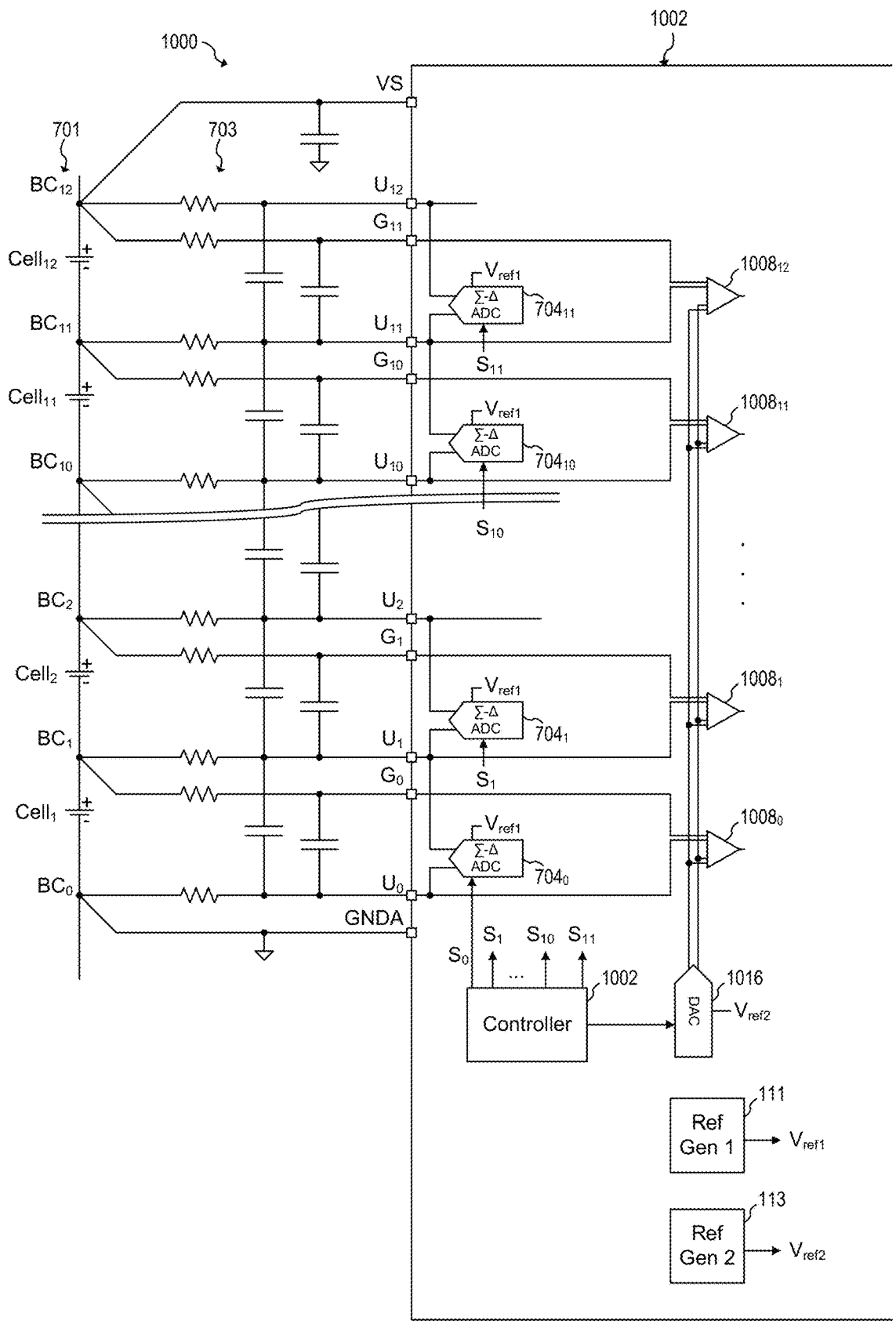
FIG. 10 shows a schematic diagram of a portion of a battery management system, according to another embodiment of the present invention.

FIG. 10 shows a schematic diagram of a portion of battery management system 1000, according to an embodiment of the present invention. Battery management system 1000 includes battery pack 701 and battery monitor IC 1002 coupled to battery pack 701 via analog filter and balancing network 703. Battery management system 1000 operates in a similar manner than battery management system 400. Battery management system 1000, however, implements each voltage measurement circuit 410 with a respective Σ-Δ ADC 704 and each of the voltage measurement circuits 512 with a respective comparator circuit 1008. Reference generator 111 provides reference voltage $V_{ref1}$ to all 12 Σ-Δ ADC 704 while reference generator 113 provides reference voltage $V_{ref2}$ to DAC 1016, which provides a reference to all comparator circuits 1008.

During normal operation, each of the comparator circuits 1008 operates as a window comparator. The high threshold and low threshold of each comparator circuit 1008 is provided by DAC 1016.

During the measurement time, the respective Σ-Δ ADC 704 collects samples and generates a digital value associated with the measured voltage while the respective comparator circuit 1008 generates a plurality of comparison results and generates as a final value the most frequent comparison result. For example, assuming that battery cell$_1$ has voltage $V_3$ (e.g., 3.6 V) across its terminals, Σ-Δ ADC 704$_0$ collects a plurality of samples during a first measurement time and generates as a result a digital value that corresponds to 3.6 V. During the same first measurement time, comparator circuit 1008$_0$ compares the value at its inputs with the values provided by DAC 1016 and, for each comparison, generates a value (e.g., 0) representative of the input being outside the window if the voltage is outside the window and a value (e.g., 1) representative of the input being inside the window if the voltage is inside the window. If comparator circuit 1008$_0$ generates Z samples (e.g., 100 samples), of which more samples (e.g., 51 or more) are inside the window (e.g., 1) and less samples (e.g., 49 or less samples) are outside the window (e.g., 0), the final result is that the input is inside the window (e.g., 1), which means that the sampled voltage is within the limits provided by DAC 1016. If instead, out of the Z samples, more samples are outside the window (e.g., 0) and less samples are inside the window (e.g., 1), the final result is that the input is outside the window (e.g., 0), which means that the sampled voltage is outside the window provided by DAC 1016. The same measurement is performed for each battery cell of battery pack 701. In this way, comparator circuits 1008 may be used to verify that the voltage measured by the respective Σ-Δ ADC 704 is inside the window specified by DAC 1016.

In some embodiments, comparator circuit 1008$_0$ generates a 0 when the input is outside the window and a 1 when the input is inside the window. In other embodiments, comparator circuit 1008$_0$ generates a 1 when the input is outside the window and a 0 when the input is inside the window. In other embodiments, comparator circuit 1008$_0$ generates a negative value when the input is outside the window and a positive value when the input is inside the window. In other embodiments, comparator circuit 1008$_0$ generates a positive value when the input is outside the window and a negative value when the input is inside the window. Other implementations are possible.

In some embodiments, DAC 1016 may set the high threshold to the same level as the maximum recommended operating voltage for the battery cell (e.g., 4.5 V for a lithium ion cell) and the low threshold to the minimum operating voltage for the battery cell (e.g., 2.7 V for a lithium ion cell). Other embodiments may implement a tighter window, such as, for example, a 50 mV window, or lower.

The voltage curve of a battery cell, such as a lithium battery cell, across different charge levels is not linear. For example, when a lithium battery cell is fully charged, the voltage across the battery cell may be as high as 4.2 V or higher, and when the lithium battery cell is discharged, the voltage across the battery cell may be 3 V or lower. During most of the time (e.g., from 80% charge level to 20% charge level) the voltage may be about 3.6 V. To achieve a tight window (of e.g., 5 mV) of comparison for comparator circuits 1008 during different points in the charge curve, some embodiments dynamically generate the values of the window. For example, some embodiments may make a first measurement with the respective Σ-Δ ADC 704 during a first time, then configure DAC 1016 to generate a window centered at the measured value, and then simultaneously measure during a second time the voltage across the battery cell with the respective Σ-Δ ADC 704 and the respective comparator circuit 1008.

Figure 11:
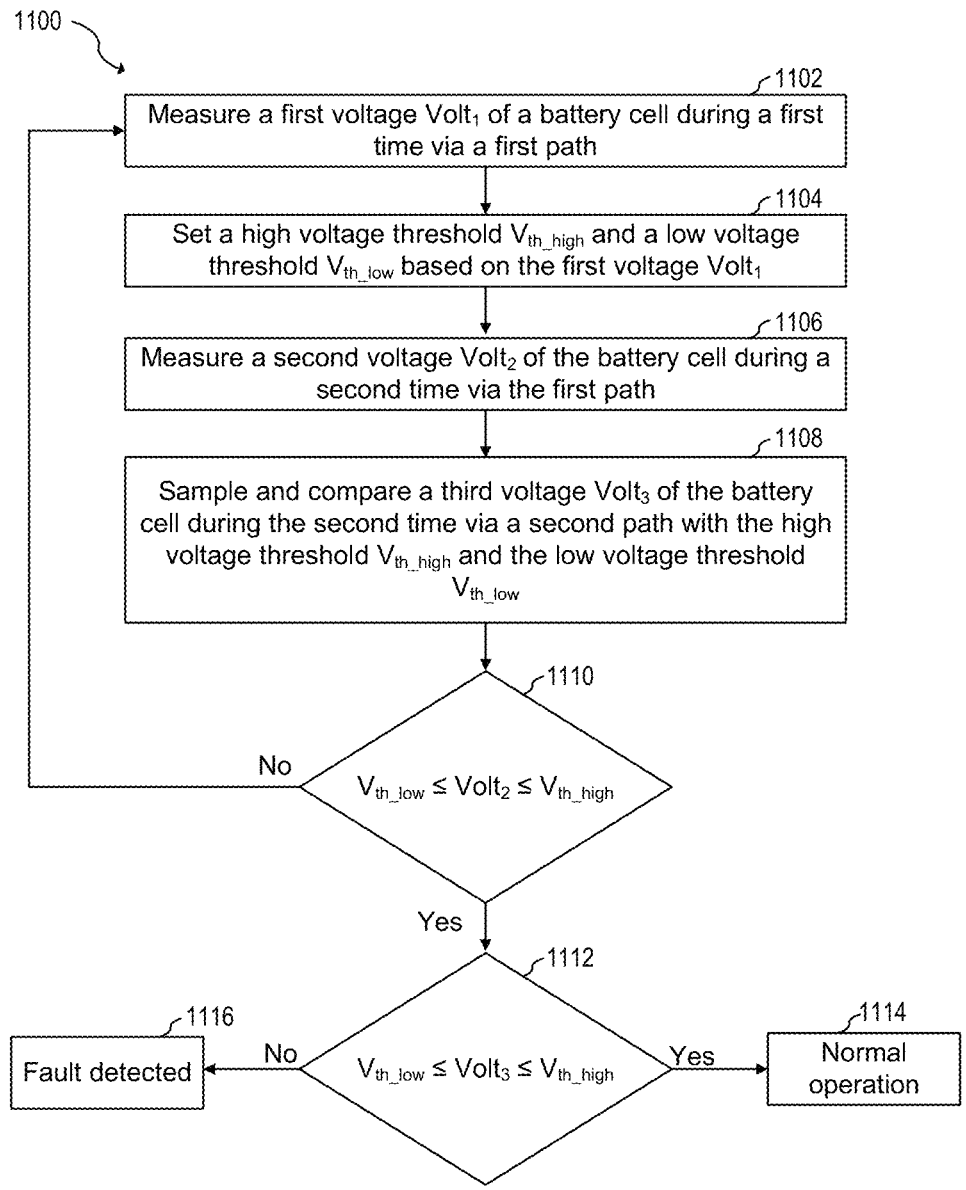
FIG. 11 shows a flow chart of an embodiment method of detecting a failure of a battery management system, according to an embodiment of the present invention.

FIG. 11 shows a flow chart of embodiment method 1100 of detecting a failure of a battery management system, according to an embodiment of the present invention. Method 1100 may be implemented using battery management system 1000. Alternatively, method 1100 may be implemented in other battery management system implementations. The discussion that follows assumes that battery management system 1000, as shown in FIG. 10, implements method 1100.

During step 1102, a first voltage Volt, across a battery cell, such as battery cell $cell_1$ of battery pack 701, is measured by a first voltage measurement circuit, such as, for example, Σ-Δ ADC $704_0$ via a first path during a first time.

During step 1104, a high voltage threshold $V_{th\_high}$ and a low voltage threshold $V_{th\_low}$ are set based on the first voltage. For example, if the first voltage measured is 3.6 V, the high voltage threshold $V_{th\_high}$ may be set to 3.65 V and the low voltage threshold $V_{th\_low}$ may be set to 3.55 V. In some embodiments, the measured voltage may be centered between the high voltage threshold $V_{th\_high}$ and a low voltage threshold $V_{th\_low}$ selected. In other embodiments, the measured voltage may not be centered between the high voltage threshold $V_{th\_high}$ and a low voltage threshold $V_{th\_low}$ selected. The voltage thresholds are applied to a window comparator, such as comparator circuit $1008_0$ by using, for example a DAC, such as DAC 1016.

During steps 1106, a second voltage $Volt_2$ is measured using the first voltage measurement circuit during a second time. During the same second time, a third voltage $Volt_3$ is sampled with the comparator circuit to determine whether the voltage Volt3 is inside the window specified by the high voltage threshold $V_{th\_high}$ and the low voltage threshold $V_{th\_low}$.

If the second voltage $Volt_2$ is outside the window, step 1102 is executed again, as shown by step 1110. Voltage $Volt_2$ may be outside the window, for example, because of a sudden spike in current. If voltage $Volt_2$ is inside the window and the comparator circuit indicates that the third voltage $Volt_3$ is inside the window, then the battery management system is operating normally, and no errors are affecting the measurements. Else, if voltage $Volt_2$ is inside the window and the comparator circuit indicates that the third voltage $Volt_3$ is outside the window, a fault is detected, as shown by steps 1112 and 1116.

In some embodiments, method 1100 is executed sequentially in each battery cells. In other embodiments, multiple memory cells (such as 2, 3, 4, or more, including all memory cells of battery pack 701) execute method 1100 simultaneously.

Example embodiments of the present invention are summarized here. Other embodiments can also be understood from the entirety of the specification and the claims filed herein.

Example 1. A method for providing battery diagnostics, the method including: measuring a first voltage across a first battery cell of a rechargeable battery via a first measurement path of a network using a first measurement circuit, measuring the first voltage including taking at least one first voltage sample during a first time period using the first measurement circuit; measuring a second voltage across the first battery cell via a second measurement path of the network using a second measurement circuit, measuring the second voltage including taking at least one second voltage sample during the first time period using the second measurement circuit, where the second measurement path of the network is different from the first measurement path of the network; comparing the measured first voltage with the measured second voltage; and generating a diagnostic output signal based on the comparison.

Example 2. The method of example 1, where the at least one first voltage sample is taken using a first measurement scheme and the at least one second voltage sample is taken using a second measurement scheme, where the second measurement scheme is different from the first measurement scheme.

Example 3. The method of one of examples 1 or 2, where measuring the first voltage further includes taking a first plurality of voltage samples during the first time period using the first measurement circuit; and where measuring the second voltage further includes taking a second plurality of voltage samples during the first time period using the second measurement circuit.

Example 4. The method of one of examples 1 to 3, where measuring the second voltage further includes averaging an output of the second measurement circuit using an averaging circuit coupled to the second measurement circuit.

Example 5. The method of one of examples 1 to 4, where the diagnostic output signal is asserted when a difference between the measured first voltage and the measured second voltage is higher than a first voltage threshold.

Example 6. The method of one of examples 1 to 5, where the first measurement circuit has a first dominant pole and the second measurement circuit has a second dominant pole, where the method further includes matching the first dominant pole and the second dominant pole.

Example 7. The method of one of examples 1 to 6, where a first total effective filtering characteristic of the first measurement path together with the first measurement circuit is substantially similar to a second total effective filtering characteristic of the second measurement path together with the second measurement circuit.

Example 8. The method of one of examples 1 to 7, further including: providing a first reference voltage to the first measurement circuit with a first reference voltage generator; and providing a second reference voltage to the second measurement circuit with a second reference voltage generator different from the first reference voltage generator.

Example 9. The method of one of examples 1 to 8, further including: providing the first reference voltage to a third measurement circuit with the first reference voltage generator, where the third measurement circuit and the first measurement circuit are based on a same measurement scheme; measuring a third voltage across a second battery cell of the rechargeable battery via a third measurement path of the network using the third measurement circuit, measuring the third voltage including taking a third plurality of third voltage samples during a second time period using the third measurement circuit, the second time period occurring after the first time period, the second battery cell coupled in series with the first battery cell; measuring a fourth voltage across the second battery cell via a fourth measurement path of the network using the second measurement circuit, measuring the fourth voltage including taking a fourth plurality of fourth voltage samples during the second time period using the second measurement circuit, the fourth measurement path being different than the third measurement path; comparing the measured third voltage with the measured fourth voltage; and asserting the diagnostic output signal when a difference between the third voltage and the fourth voltage is higher than a first voltage threshold.

Example 10. A circuit including: a first measurement circuit configured to be coupled to a first battery cell via a first path of a network; a second measurement circuit configured to be coupled to the first battery cell via a second path of the network, the second path being different than the first path; and a controller configured to: cause the first measurement circuit to measure a first plurality of voltage samples across first and second terminals of the first battery cell during a first time period, cause the second measurement circuit to measure a second plurality of voltage samples across the first and second terminals of the first battery cell during the first time period, compare an output of the first measurement circuit with an output of the second measurement circuit, and generate a diagnostic output signal based on the comparison.

Example 11. The circuit of example 10, where the first measurement circuit has a different architecture than the second measurement circuit.

Example 12. The circuit of one of examples 10 or 11, where the first measurement circuit has a first dominant pole, the second measurement circuit has a second dominant pole, and the first dominant pole is substantially equal to the second dominant pole.

Example 13. The circuit of one of examples 10 to 12, further including: a first reference voltage generator coupled to the first measurement circuit; and a second reference voltage generator coupled to the second measurement circuit.

Example 14. The circuit of one of examples 10 to 13, where the first measurement circuit includes a sigma-delta analog-to-digital converter (ADC) and the second measurement circuit includes a successive approximation register (SAR) analog-to-digital converter (ADC).

Example 15. The circuit of one of examples 10 to 13, where the second measurement circuit includes a window comparator, and where the controller is configured to set an upper limit of the window comparator and a lower limit of the window comparator based on the output of the first measurement circuit.

Example 16. The circuit of one of examples 10 to 15, further including: a first sensing terminal coupled to the first measurement circuit and configured to be coupled to the first terminal of the first battery cell via the network; a second sensing terminal coupled to the first measurement circuit and to the second measurement circuit and configured to be coupled to the second terminal of the first battery cell; and a first power terminal coupled to the second measurement circuit and configured to be coupled to the first terminal of the first battery cell.

Example 17. The circuit of one of examples 10 to 15, further including: a first sensing terminal coupled to the first measurement circuit and configured to be coupled to the first terminal of the first battery cell via the network; a second sensing terminal coupled to the first measurement circuit and configured to be coupled to the second terminal of the first battery cell; a first power terminal coupled to the second measurement circuit and configured to be coupled to the first terminal of the first battery cell; and a second power terminal coupled to the second measurement circuit and configured to be coupled to the second terminal of the first battery cell.

Example 18. The circuit of one of examples 10 to 17, where a first total effective filter characteristic of the first path is as about equal to a second total effective filter characteristic of the second path.

Example 19. The circuit of one of examples 10 to 18, where the network includes a balancing network.

Example 20. The circuit of one of examples 10 to 19, where the first measurement circuit has a first step response, the second measurement circuit has a second step response, and the first response is substantially equal to the second step response.

Example 21. A battery management system including: a rechargeable battery including N battery cells coupled in series, where N is a positive integer greater than zero; a balancing network coupled to the rechargeable battery; and a battery monitoring circuit coupled to the balancing network, the battery monitoring circuit including: a sigma-delta analog-to-digital converter (ADC) having an input configured to be coupled to a first battery cell of the N battery cells via a first path of the balancing network, the sigma-delta ADC coupled to a first reference voltage generator; a measurement circuit having an input configured to be coupled to the first battery cell via a second path of the balancing network, the second path being different from the first path, the measurement circuit coupled to a second reference voltage generator different from the first reference voltage generator, the measurement circuit having a different architecture than the sigma-delta ADC; and a controller configured to: control the sigma-delta ADC to measure a first plurality of voltage samples across first and second terminals of the first battery cell during a first time period, control the measurement circuit to measure a second plurality of voltage samples across the first and second terminals of the first battery cell during the first time period, compare an output of the sigma-delta ADC with an output of the measurement circuit, and generate a diagnostic output signal based on the comparison.

Example 22. The battery management system of example 21, further including N sigma-delta ADCs and N measurement circuits, where the N sigma-delta ADCs include the sigma-delta ADC, and where each of the N sigma-delta ADCs is coupled to a respective battery cell of the N battery cells, and where the N measurement circuits include the measurement circuit, and where each of the N measurement circuits is coupled to a respective battery cell of the N battery cells.

Example 23. The battery management system of example 21, where the sigma-delta ADC has a first dominant pole of Nth order, where N is a positive integer greater or equal to 1, the measurement circuit has a second dominant pole of the Nth order, and the first dominant pole is substantially equal to the second dominant pole.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A battery monitoring circuit comprising:
a first multiplexer having inputs coupled configured to be coupled to a plurality of battery cells, and a second multiplexer having inputs configured to be coupled to the plurality of battery cells;
a first measurement circuit coupled to an output of the first multiplexer, and a second measurement circuit different from the first measurement circuit coupled to an output of the second multiplexer; and a controller configured to:
cause the first multiplexer to couple a first battery cell to the first measurement circuit via a first signal path during a first time period, and cause the second multiplexer to couple the first battery cell to the second measurement circuit via a second signal path different from the first signal path during the first time period, and cause the first measurement circuit to measure a first plurality of voltage samples across the first battery cell, and cause the second measurement circuit to measure a second plurality of voltage samples across the first battery cell during the first time period.

2. The battery monitoring circuit of claim 1, wherein the controller is further configured to:
compare an output of the first measurement circuit with an output of the second measurement circuit; and
generate a diagnostic output based on the comparison.

3. The battery monitoring circuit of claim 1, wherein the first measurement circuit has a different architecture from the second measurement circuit.

4. The battery monitoring circuit of claim 1, wherein the first measurement circuit has a first dominant pole, the second measurement circuit has a second dominant pole, and the first dominant pole is substantially equal to the second dominant pole.

5. The battery monitoring circuit of claim 1, further comprising:
a first reference voltage generator coupled to the first measurement circuit; and
a second reference voltage generator coupled to the second measurement circuit.

6. The battery monitoring circuit of claim 1, wherein the first measurement circuit comprises a sigma-delta analog-to-digital converter and the second measurement circuit comprises a successive approximation register analog-to-digital converter.

7. The battery monitoring circuit of claim 1, wherein the second measurement circuit comprises a window comparator, and wherein the controller is configured to set an upper limit of the window comparator and a lower limit of the window comparator based on the output of the first measurement circuit.

8. The battery monitoring circuit of claim 1, further comprising terminals configured to be coupled to the plurality of battery cells, and coupled to the first multiplexer or the second multiplexer, wherein the first signal path includes a first terminal coupled to a first node of the first battery cell, and the second signal path includes a second terminal different from the first terminal coupled to the first node of the first battery cell.

9. The battery monitoring circuit of claim 1, wherein:
the first multiplexer is configured to couple first and second terminals of the first battery cell to first and second terminals of the first measurement circuit via a first combination of connection pins; and
the second multiplexer is configured to couple the first and second terminals of the first battery cell to first and second terminals of the first measurement circuit via a second combination of connection pins.

10. A battery monitoring circuit comprising:
a plurality of first measurement circuits configured to be coupled to corresponding battery cells of a plurality of battery cells;

a multiplexer having inputs coupled configured to be coupled to the plurality of battery cells;
a second measurement circuit different from the plurality of first measurement circuits coupled to an output of the multiplexer; and
a controller configured to:
cause a first measurement circuit of the plurality of first measurement circuits to measure a first plurality of voltage samples across a first battery cell of the plurality of battery cells during a first time period, wherein the first measurement circuit is coupled to the first battery cells via a first signal path,
cause the multiplexer to couple the first battery cell to the second measurement circuit via a second signal path different from the first signal path during the first time period, and
cause the second measurement circuit to measure a second plurality of voltage samples across the first battery cell during the first time period.

11. The battery monitoring circuit of claim 10, wherein the controller is further configured to:
compare an output of the first measurement circuit with an output of the second measurement circuit; and
generate a diagnostic output based on the comparison.

12. The battery monitoring circuit of claim 10, wherein the first measurement circuit has a different architecture from the second measurement circuit.

13. The battery monitoring circuit of claim 10, wherein the first measurement circuit has a first dominant pole, the second measurement circuit has a second dominant pole, and the first dominant pole is substantially equal to the second dominant pole.

14. The battery monitoring circuit of claim 10, further comprising:
a first reference voltage generator coupled to the first measurement circuit; and
a second reference voltage generator coupled to the second measurement circuit.

15. The battery monitoring circuit of claim 10, wherein the first measurement circuit comprises a sigma-delta analog-to-digital converter and the second measurement circuit comprises a successive approximation register analog-to-digital converter.

16. The battery monitoring circuit of claim 10, wherein the first measurement circuit comprises a window comparator, and wherein the controller is configured to set an upper limit of the window comparator and a lower limit of the window comparator based on the output of the second measurement circuit.

17. The battery monitoring circuit of claim 10, further comprising terminals configured to be coupled to the plurality of battery cells, and coupled to the multiplexer or the plurality of first measurement circuits, wherein the first signal path includes a first terminal coupled to a first node of the first battery cell, and the second signal path includes a second terminal different from the first terminal coupled to the first node of the first battery cell.

18. A battery management system comprising:
a rechargeable battery comprising N battery cells coupled in series, wherein N is a positive integer greater than zero;
a balancing network coupled to the rechargeable battery; and
a battery monitoring circuit coupled to the balancing network, the battery monitoring circuit comprising:
a first measurement circuit having an input configured to be coupled to a first battery cell of the N battery cells via a first path of the balancing network, the first measurement circuit coupled to a first reference voltage generator;

a second measurement circuit different from the first measurement circuit having an input configured to be coupled to the first battery cell via a second path of the balancing network, the second path being different from the first path, the second measurement circuit coupled to a second reference voltage generator different from the first reference voltage generator, the second measurement circuit having a different architecture than the first measurement circuit; and a controller configured to:
  control the first measurement circuit to measure a first plurality of voltage samples across first and second terminals of the first battery cell during a first time period,
  control the second measurement circuit to measure a second plurality of voltage samples across the first and second terminals of the first battery cell during the first time period,
  compare an output of the first measurement circuit with an output of the second measurement circuit, and
  generate a diagnostic output signal based on the comparison.

19. The battery management system of claim 18, further comprising N first measurement circuits and N second measurement circuits, wherein the N first measurement circuits include the first measurement circuit, and wherein each of the N first measurement circuits is coupled to a respective battery cell of the N battery cells, and wherein the N second measurement circuits include the second measurement circuit, and wherein each of the N second measurement circuits is coupled to the respective battery cell of the N battery cells.

20. The battery management system of claim 18, wherein the first measurement circuit has a first dominant pole of Nth order, wherein N is a positive integer greater or equal to 1, the second measurement circuit has a second dominant pole of the Nth order, and the first dominant pole is substantially equal to the second dominant pole.

* * * * *